United States Patent
Loh

(10) Patent No.: US 11,342,933 B2
(45) Date of Patent: May 24, 2022

(54) LOSSY SIGNIFICANCE COMPRESSION WITH LOSSY RESTORATION

(71) Applicant: Advanced Micro Devices, Inc., Santa Clara, CA (US)

(72) Inventor: Gabriel H. Loh, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/220,540

(22) Filed: Dec. 14, 2018

(65) Prior Publication Data

US 2020/0195273 A1  Jun. 18, 2020

(51) Int. Cl.
*G06F 17/00* (2019.01)
*H03M 7/30* (2006.01)
*G06N 20/00* (2019.01)
*G06F 17/18* (2006.01)

(52) U.S. Cl.
CPC .......... *H03M 7/3059* (2013.01); *G06F 17/18* (2013.01); *G06N 20/00* (2019.01)

(58) Field of Classification Search
CPC ........ G06N 20/00; G06N 3/08; G06N 3/0472; G06F 17/18; G06F 16/00; G06F 16/1724; G06F 16/1727; G06F 16/1744; G06F 3/0608; G06F 3/064; H03M 7/3059; H03M 7/6029; H03M 7/40; H03M 7/30; H04N 19/00
See application file for complete search history.

(56) References Cited

U.S. PATENT DOCUMENTS

| | | | |
|---|---|---|---|
| 8,989,257 | B1 | 3/2015 | Akhter et al. |
| 10,169,359 | B1* | 1/2019 | Pinho ..................... G06F 16/182 |
| 10,572,378 | B2* | 2/2020 | Li ........................... G06F 12/08 |
| 2014/0132429 | A1* | 5/2014 | Scoville ............. H03M 7/3079 341/87 |
| 2016/0021396 | A1 | 1/2016 | Metzler et al. |
| 2016/0099723 | A1* | 4/2016 | Kletter ................ H03M 7/3088 341/51 |
| 2018/0300606 | A1 | 10/2018 | Corkery et al. |
| 2020/0162584 | A1* | 5/2020 | Beckman ............ H03M 7/3084 |

FOREIGN PATENT DOCUMENTS

KR    10-1738640 B1    5/2017

OTHER PUBLICATIONS

Youjie Li et al., "A Network-Centric Hardware/Algorithm Co-Design to Accelerate Distributed Training of Deep Neural Networks", 2018 51st Annual IEEE/ACM International Symposium on Microarchitecture (MICRO), Oct. 20-24, 2018, pp. 175-188.

Gupta, S. et al., "Deep Learning with Limited Numerical Precision", Proceedings of the 32nd International Conference on Machine Learning, vol. 37, pp. 1737-1746, Lille, France, Jul. 2015.

* cited by examiner

*Primary Examiner* — Greta L Robinson
(74) *Attorney, Agent, or Firm* — Volpe Koenig

(57) ABSTRACT

Described are systems and methods for lossy compression and restoration of data. The raw data is first truncated. Then the truncated data is compressed. The compressed truncated data can then be efficiently stored and/or transmitted using fewer bits. To restore the data, the compressed data is then decompressed and restoration bits are concatenated. The restoration bits are selected to compensate for statistical biasing introduced by the truncation.

20 Claims, 7 Drawing Sheets

LOSSY SIGNIFICANCE COMPRESSION WITH LOSSY RESTORATION

BACKGROUND

Computer memories, caches, and links are designed to be lossless in order to exactly reproduce stored information. However, in some applications such as machine learning, exact values are not required. In fact, in many of these circumstances using exact values results in diminished performance of the machine learning system without any additional benefit.

BRIEF DESCRIPTION OF THE DRAWINGS

A more detailed understanding may be had from the following description, given by way of example in conjunction with the accompanying drawings wherein.

DETAILED DESCRIPTION

Figure 1:
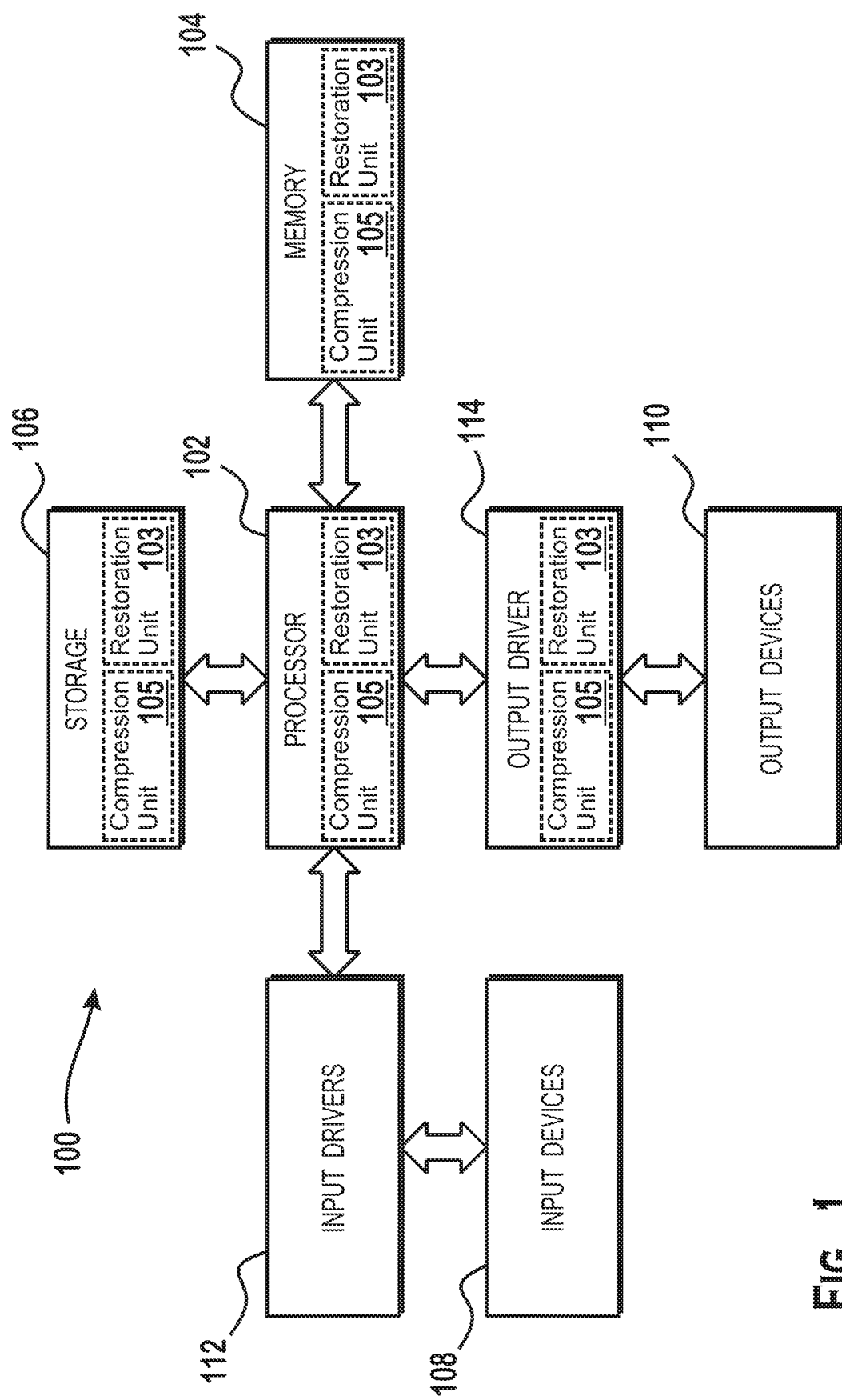
FIG. 1 is a block diagram of an example device in which one or more disclosed implementations may be implemented.

The present disclosure is directed to techniques for lossy compression and restoration of data. According to the technique, the raw data is truncated. Then the truncated data is compressed. The compressed truncated data can then be efficiently stored and transmitted using fewer bits. To restore the data, the compressed data is decompressed. Restoration bits are then added to the decompressed data. In some implementations, the restoration bits are selected to compensate for statistical biasing introduced by the truncation.

The systems and methods for lossy compression and restoration of data disclosed can be applied to Central Processing Units (CPUs), Graphics Processing Units (GPUs), Accelerated Processing Units (APU), Field Programmable Gate Arrays (FPGAs), or any other processing device that utilizes memory, caches and interconnects. In some instances, the techniques for lossy compression and restoration of data may be used for memory compression, cache compression, register file compression, link compression, and other instances of data transmission and storage.

In many machine learning systems, workloads are bottlenecked by memory. Specifically, many machine learning workloads involve using an artificial neural network to generate one or more prediction scores based on one or more input values. Processing through the artificial neural network involves calculation of transfer functions for each neuron, with inputs to each neuron biased based on adjustable weights. In large neural network systems, the large number of neurons, and thus weights, results in a large amount of data transferred between processing units and memory. Specifically, in the course of generating a prediction, a large number of neuron weights may be transmitted between memory and the processing units. This fact can result in memory bandwidth being a bottleneck for the speed with which such predictions are generated.

An effective compression technique can be used to reduce the amount of data that is transmitted between the processing units and the memory. This technique takes advantage of the fact that neuron weights often have a "satisfactory" precision. Values that are more precise than this precision provide little or no additional accuracy to the predictive model. The technique thus involves truncating weight values to a certain precision and then compressing the result. A favorable technique for compression is a frequent value compression technique. In this technique, identical values in a dataset are replaced with key values in a dictionary. Truncation of weight values to certain precision allows for a dictionary to be constructed based on the more significant bits of the weight values, which results in a higher likelihood that particular weight values can actually be replaced with dictionary values. Restoration of the weight values involves decompressing the compressed values and then restoring the decompressed values with restoration bits in the least significant bits. The specific restoration bits that are used may be fixed bits (such as the value 0), random bits, or may be selected according to any technically feasible technique. Random bits provide a benefit in that random bits reduce the bias towards certain values that could be introduced with fixed bits. Fixed bits provide the benefit of ease of implementation. Additional details are provided below.

FIG. 1 is a block diagram of an example device 100 in which one or more aspects of the present disclosure are implemented. The device 100 includes, for example, a computer (such as a server, desktop, or laptop computer), a gaming device, a handheld device, a set-top box, a television, a mobile phone, or a tablet computer. The device 100 includes a processor 102, a memory 104, a storage device 106, one or more input devices 108, and one or more output devices 110. The device 100 optionally includes an input driver 112 and an output driver 114. It is understood that the device 100 optionally includes additional components not shown in FIG. 1.

The processor 102 includes one or more of: a central processing unit (CPU), a graphics processing unit (GPU), a CPU and GPU located on the same die, or one or more processor cores, wherein each processor core is a CPU or a GPU. The memory 104 is located on the same die as the processor 102 or separately from the processor 102. The memory 104 includes a volatile or non-volatile memory, for example, random access memory (RAM), dynamic RAM, or a cache.

The storage device 106 includes a fixed or removable storage, for example, a hard disk drive, a solid state drive, an optical disk, or a flash drive. The input devices 108 include one or more of a camera, keyboard, a keypad, a touch screen, a touch pad, a detector, a microphone, an accelerometer, a gyroscope, or a biometric scanner. The output devices 110 include one or more of a display, a speaker, a printer, a haptic feedback device, one or more lights, or an antenna.

The input driver 112 communicates with the processor 102 and the input devices 108 and permits the processor 102 to receive input from the input devices 108. The output driver 114 communicates with the processor 102 and the output devices 110 and permits the processor 102 to send output to the output devices 110.

A compression unit 105 and a restoration unit 103 are shown in several different forms. The compression unit 105 receives data and outputs compressed data. The restoration unit 103 receives compressed data and outputs restored data. In a first form, the compression unit 105 and the restoration unit 103 are software that is stored in the memory 104 and that executes on the processor 102 as shown. In this form, when not being executed, the compression unit 105 and/or restoration unit 103 may be stored in storage 106. In a second form, the compression unit 105 and a restoration unit 103 are at least a portion of a hardware engine that resides in output drivers 114. In other forms, the compression unit 105 and a restoration unit 103 are a combination of software and hardware elements, with the hardware residing, for example, in output drivers 114, and the software executed on, for example, the processor 102. The compression unit 105 stores the compressed data in memory, such as in memory 104, or any other memory such as a buffer stored in or associated with a hardware implementation of the compression unit 105, or any other memory. Similarly, the restoration unit 103 retrieves the compressed data from memory, restores the data to a restored state, and provides the restored data to other components within the device 100. Although the compression unit 105 and restoration unit 103 are described in certain example modes of implementation, it should be understood that the principles of compression and restoration could be used in any context where such compression and/or restoration makes sense. In addition, in any particular implementation, compression, restoration, or both compression and restoration as described herein may be implemented.

In some instances, the processor 102 implements a set of instructions to load and store data using the compression unit 105 and/or the restoration unit 103. If the processor 102 transmits a lossy store to the compression unit 105, along with data to be stored in a lossy manner, then the compression unit 105 performs the techniques described herein for truncating and compressing data, which is then output for storage. If the processor 102 transmits a lossy load instruction to the restoration unit 103, specifying compressed data to be loaded in a lossy manner, then the restoration unit 103 fetches the compressed data, performs the decompression and restoration techniques, and provides the decompressed, restored data back to the processor 102 for use.

In another example, the compression and decompression are used for cache compression. In this example, when the processor 102 executes a lossy load instruction (which targets one or more registers), the compression unit 105 fetches (e.g., from a backing memory), truncates, and compresses a cache line and stores the compressed cache line in the cache. Then the cache transmits a compressed version of the requested data to the processor 102 for processing. The processor includes a restoration unit 103 that restores the data before being placed in its registers. When the processor executes a lossy store instruction, the value in the registers are recompressed by the compression unit 105, and these compressed values are stored in the cache. When a cache writeback occurs, a restoration unit 103 restores the data and places that data in a backing memory.

In other instances, upon receipt of the lossy load instruction, the cache reads the data from the cache, compresses it with compression unit 105, and delivers the compressed data back to the processor 102. The processor 102 then utilizes restoration unit 103 to restore the decompressed data.

Although it is stated that the processor 102 can implement these instructions, any processing unit, including those described and not described in the present disclosure, can implement and execute either or both of these instructions. Further, in different implementations compressed data may be used in the cache only, in the backing memory only or a combination of both the cache and the backing memory. The above described techniques for storing and using compressed data in a cache are examples only and it should be understood that the compression unit 105 and restoration unit 103 may be used in any technically feasible manner to compress and restore data for use by a processor and storage in a cache or in a backing memory.

Figure 2A:
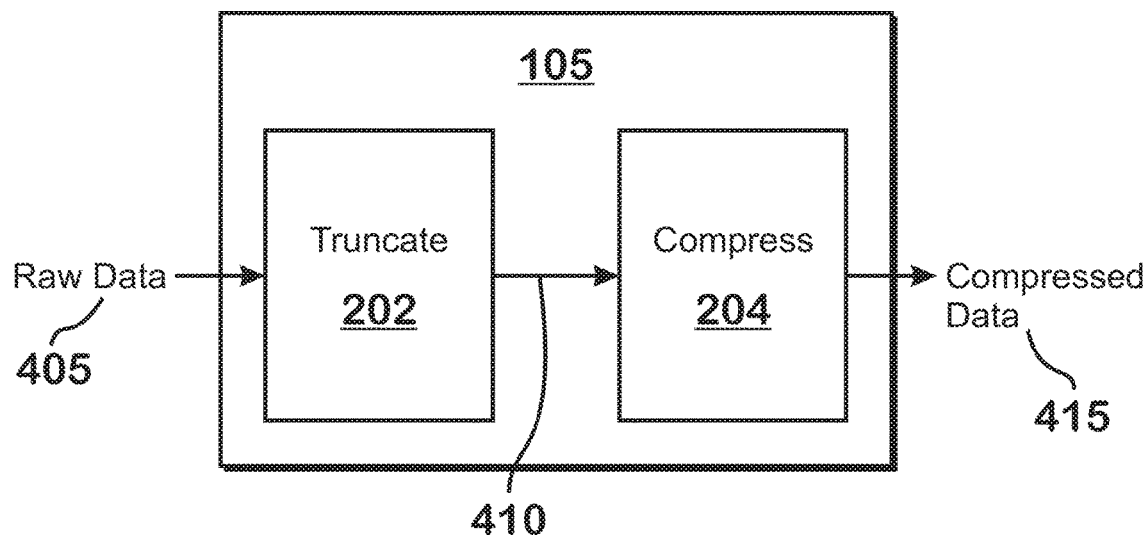
FIG. 2A is a block diagram of a compression unit according to an example.

FIG. 2A is a block diagram of an example compression unit 105. The compression unit 105 includes a truncation unit 202 coupled to a compression engine 204. In some instances, the truncation unit 202 and the compression engine 204 are implemented as fixed function circuity. In other instances, the truncation unit 202 and the compression engine 204 are implemented as software or firmware executing on a processor. In yet other instances, the truncation unit 202 and the compression engine 204 are implemented as a combination of fixed function circuity and software.

Raw data 405 is received by the truncation unit 202. In some instances, the raw data 405 is retrieved from the memory 104, the storage device 106, the input driver 112 or a cache line. The truncation unit 202 forms truncated data 410 by truncating bits of each fixed-sized piece of data (e.g., word) in the raw data 405. In some implementations, each fixed size piece of data is the same size as a word in the computer system in which the compression unit 105 is included. In examples, this size is 32 bits. In other examples, the fixed size pieces of data processed by the compression unit 105 are a different size than the size as a word in the computer system in which the compression unit 105 is included. Any technically feasible size for the fixed-size piece of data may be used.

The number of bits truncated by the truncation unit 202 is set by a parameter k. In some instances, the parameter k is a software-defined argument. If defined via software, it could be stored in a portion of the memory 104. Alternatively, the parameter can be passed to the truncation unit 202 as an argument to an instruction (for example, a lossy store instruction) (either through a register argument or as an immediate value) from the processor 102 or the output driver 114.

In one implementation, when the compression unit 105 is used in a machine learning system, such as machine learning system 500B, the machine learning system can pass a gradually decreasing value of k to the compression unit 102 as the training process brings the neural network model closer to a final state. By gradually reducing the value of k to incrementally tradeoff compression density for algorithmic precision, processing speed in early stages of training, where high precision is not necessary, can be increased. Later—e.g., after a certain number of training iterations, the parameter k can be reduced to improve precision of the predictive model. In other instances, the parameter k is modified based on convergence criteria or other dynamic metrics associated with the machine learning algorithm.

In other instances, the parameter k is determined based on the available resources of the device 100. In other instances, k is a fixed number. In yet other instances, the parameter k is dynamically determined based on previously compressed data For example, an initial value of k may be used to compress the data. The compressed data is then analyzed to determine the effect of a larger k value. If the effect is below a predetermined threshold, the larger value of k is then used by the compression unit 105.

The truncated data 410 is then received by the compression engine 204. The compression engine 204 executes a compression algorithm on the truncated data 410 to form the compressed data 415. In some instances, the compression algorithm uses dictionary-based frequent value compression (FVC). In other instances, run-length compression, Huffman-based compression, or base-delta compression may be used. In alternative implementations, any technically feasible compression algorithm or combinations of algorithms may be used. The compressed data 415 is then output to other components within the device 100.

Figure 2B:
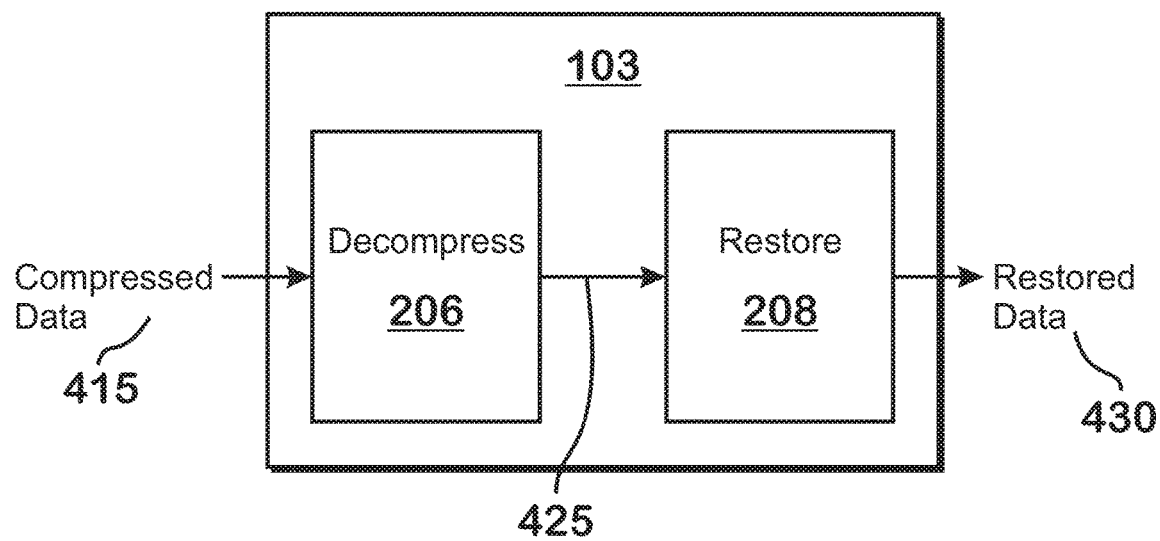
FIG. 2B is a block diagram of a restoration unit according to an example.

FIG. 2B is a block diagram of an example restoration unit 103. The restoration unit 103 includes a decompression unit 206 coupled to a restoration unit 208. In some instances, the decompression unit 206 and the restoration unit 208 are implemented as fixed function circuity. In other instances, the decompression unit 206 and the restoration unit 208 are implemented by a processor executing software or firmware. In yet other instances, the decompression unit 206 and the restoration unit 208 are implemented as a combination of fixed function circuity and processor implemented software.

Compressed data 415 is received by the decompression unit 206. In some instances, the compressed data 415 is retrieved from the memory 104, the storage device 106, the input driver 112 or a cache line. The decompression engine 206 executes a decompression algorithm on the compressed data 415 to form decompressed truncated data 420. The type of decompression performed is determined based on the type of compression used by the compression unit 105. For example, when FVC compression is used, the decompressed truncated data is formed based upon the dictionary 435.

The decompressed truncated data 420 is then received by the restoration unit 208. The restoration unit 208 selects restoration bits 425. The restoration unit 208 then concatenates the restoration bits 425 to the decompressed truncated data 420 to form restored data 430. The restored data 430 is then outputted to other components within the device 100.

The number of restoration bits 425 is equal to the parameter k. In some instances, truncated data 420 selects restoration bits 425 that are fixed value such as all zeros. However, using a fixed value such as all zeroes biases the data by rounding the data towards negative infinity. A higher value such as "FF" would round the data towards positive infinity. In either case, a shift in the values is introduced by the fixed technique. Introducing random values helps alleviate this biasing.

As a result, in other instances, the restoration unit 208 selects restoration bits 425 using a stochastic restoration process. In the stochastic restoration statistical techniques are used to select the restoration bits 425.

In an example, the stochastic restoration process uses a pseudo-random number generator to generate the restoration bits 425. In other implementations, the restoration unit 208 implements the stochastic restoration process by sampling values from a probability distribution. In some instances, the probability distribution is parametric. An example of a parametric probability distribution that may be used is the Poisson Distribution. In these instances, restoration unit 208 determines the parameters of the parametric distribution by retrieving the parameters from a memory or dynamically determining the values based upon previously restored data. In other instances, the restoration unit 208 utilizes a non-parametric probability distribution. In some instances, the non-parametric distribution is pre-defined and retrieved from memory by the restoration unit 208. In other instances, the non-parametric distribution is dynamically determined by restoration unit 208 based upon previously restored data. For example, Markov chains and Bayesian networks can be formed using the previously restored data.

In some instances, the restoration unit 208 selectively performs the stochastic restoration process. For example, it may not be desirable to perform the stochastic restoration on a zero value. Accordingly, in this instance the restoration unit 208 does not perform the stochastic restoration process and instead selects restoration bits that are all zero. More specifically, in some implementations, the uncompressed value is 0, and the truncated value is therefore also 0. When this value is encountered, instead of stochastically selecting restoration bits 425 in such a circumstance, the restoration unit 208 selects 0 values for the restoration bits 425 so that the result is a 0 value. The reason for doing this is that if the original data is 0, it may not be appropriate to restore the data to a value other than 0, which would occur if random bits were restored to the lowest-order places.

Figures 2C, 2D:
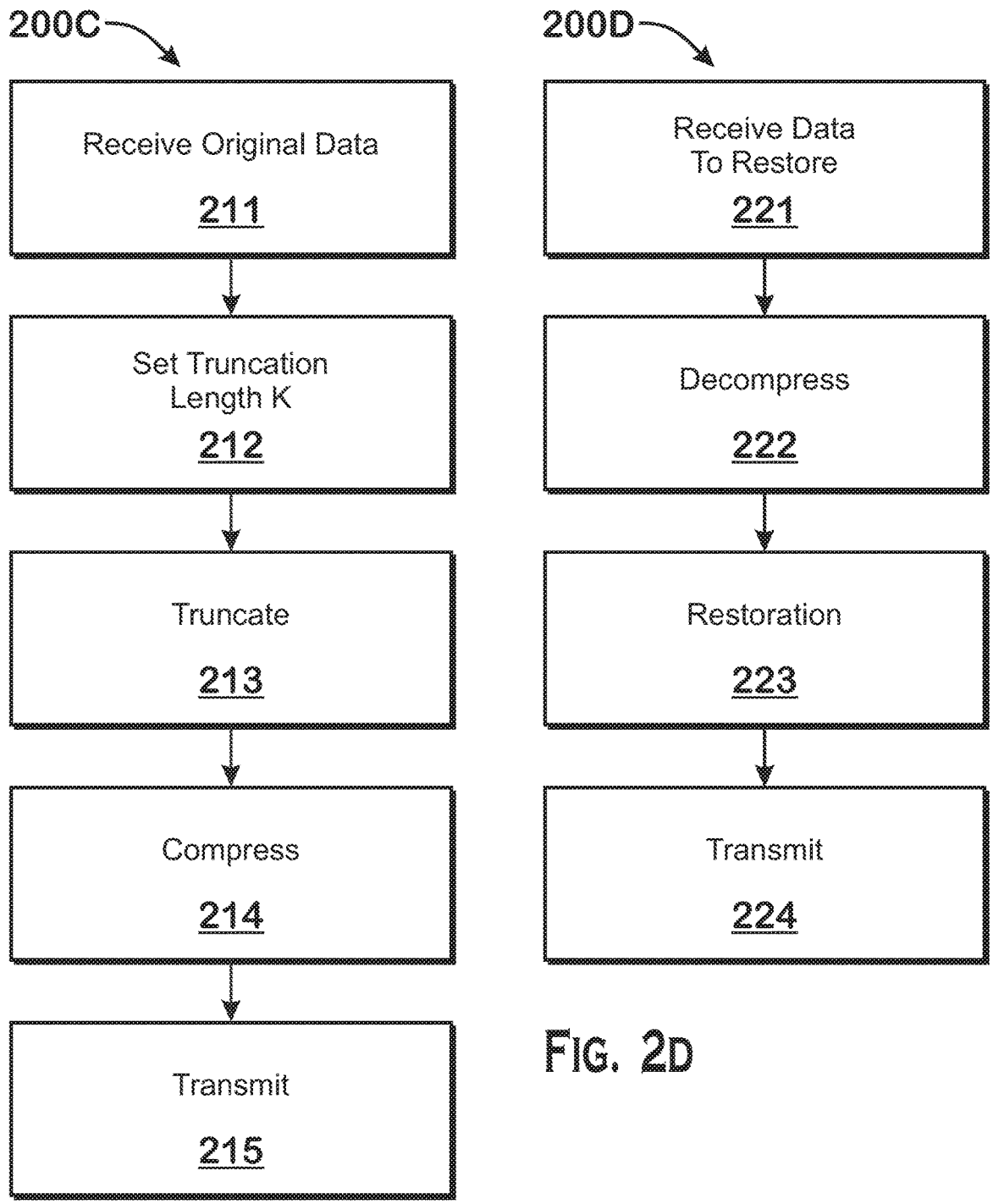
FIG. 2C is an example flow diagram of a technique to compress data.
FIG. 2D is an example flow diagram of a technique to restore compressed data.

FIG. 2C is a flow diagram of a process 200C that is implemented by the compression unit 105. In step 211 the raw data 405 is received. In some instances, the raw data 405 is retrieved from the memory 104, the storage device 106 or the input driver 112.

Optionally in step 212, the number of k bits to truncate are determined. In some instances, the parameter k is a software-defined argument. When k is software defined, the value is retrieved from the memory 104 or is passed to the truncation unit 202 via an argument from the processor 102 or the output driver 114. In other instances, k is a fixed number.

In yet other instances, the parameter k is dynamically determined based on previously compressed data. For example, an initial value of k may be used to compress the data. The compressed data is then analyzed to determine the effect of a larger k value. If the effect is below a predetermined threshold, the larger value of k is then determined as the output of step 212.

Then in step 213, the raw data 405 is truncated to form truncated data 410. The raw data 405 is truncated by truncating the k bits of each fixed-sized piece of data (e.g., word) in the raw data 405. In some implementations, each fixed size piece of data is the same size of a word in the computer system in which the compression unit 105 is included. In examples, this size is 32 bits. In other examples, the fixed size pieces of data processed by the compression unit 105 are a different size than the size of a word in the computer system in which the compression unit 105 is included. Any technically feasible size for the fixed-size piece of data may be used.

Next, in step 214 the truncated data 410 is compressed to form compressed data 415. In many instances, step 214 is performed by the compression engine 204. In some instances, the compression in step 330 is performed using dictionary-based frequent value compression (FVC). In alternative implementations, any technically feasible compression algorithm may be used.

These compression algorithms operate by analyzing a block of data and finding repeated values that can be re-encoded more efficiently. By implementing the compression on the truncated data 410, the compression algorithms are able to locate patterns of spatially local values in the data that have similar values but not precisely the same value. Traditionally, compression algorithms struggle with such patterns because while the values are similar, they are not exactly the same (or sufficiently the same depending on the exact compression algorithm). Therefore, the compression algorithms are rendered less effective.

Then in step 215 the compressed data 415 is transmitted. In some instances, the compressed data 415 is transmitted to the memory 104, the memory 104, the storage device 106 or the output driver 114.

FIG. 2D is a flow diagram of a restoration process 200D. In step 221, the compressed data 415 generated by the process 200C is received. In some instances, the compressed data 415 is retrieved from the memory 104, the storage device 106 or the input driver 112.

In step 222, the compressed data 415 is decompressed to form decompressed truncated data 420. The type of decompression performed is determined based on the type of compression used in step 214. For example, when FVC compression is used, the decompressed truncated data is formed based upon the dictionary 435.

Next in step 223, restoration bits 425 are concatenated to the decompressed truncated data to form restored data 430. The number of restoration bits 425 is equal to the parameter k. In some instances, the restoration bits 425 are all zeros. In other instances, a stochastic restoration process is used to determine the restoration bits. In the stochastic restoration statistical techniques are used to select the restoration bits 425

In some implementations, the stochastic restoration process uses a pseudo-random number generator. In other implementations, the stochastic restoration process includes sampling values from a probability distribution. In some instances, the probability distribution is parametric. For example, the distribution a Poisson Distribution. In these instances, the parameters of the parametric distribution may be pre-determined or dynamically determined based upon previously restored data. In other instances, the probability distribution may be non-parametric. In some instances, the non-parametric distribution can be pre-defined, and in other instances, the non-parametric distribution is dynamically determined based upon previously restored data. For example, Markov chains and Bayesian networks can be formed using the previously restored data. By implementing a stochastic restoration process the statistical biasing introduced by the truncation in step 320 is reduced.

Then in step 224, the restored data 430 is transmitted. In some instances, the restored data 430 is transmitted to the processor 102, the memory 104, the storage device 106 or the output driver 114.

Figure 3:
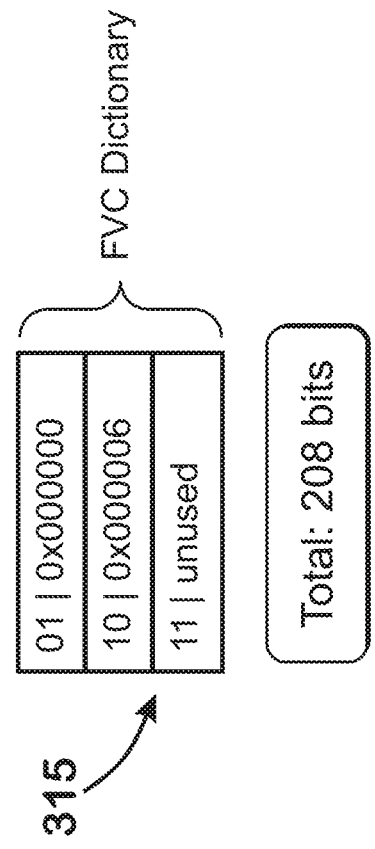
FIG. 3 is an example of data compression that is implemented using dictionary-based frequent value compression (FVC) alone.

FIG. 3 illustrates an example where FVC is used alone.

In FVC, patterns of data are identified and stored in a dictionary (such as dictionary 435). Instead of the entire data pattern being stored in the memory, an index to the dictionary entry is stored in the memory. More specifically, the FVC algorithm identifies commonly occurring patterns and creates keys for those patterns. The relationship of each pattern to each key is stored in a dictionary. By storing only the key to the pattern in the memory, fewer bits of memory are required. For decompression, the data is retrieved from the memory, and the pattern stored in the dictionary is restored using the dictionary key. This restoration is done for each key in the compressed data, so that in the restored data, the keys are replaced with the dictionary values, thereby restoring the data to an uncompressed form.

In example of FVC shown in FIG. 3, the raw data 305 consists of 256 bits that includes eight 32-bit words. In this example, each of the original 32-bit words is replaced with a 2-bit code 310 if the word can be compressed (that is, if there is a dictionary value that matches the 32-bit word). Words may be uncompressed if their values are sufficiently infrequently used such that including those values in the dictionary would not result in a net loss in total data stored. The 2-bit code 310 indicates either that the value is uncompressed (00) or that it is compressed and the 2-bit code specifies which one of up to three dictionary entries 315 are utilized. In this example, due to the diversity of values and the limited dictionary size, only a few of the 32-bit words can be compressed. Therefore, the example shows 208 bits are required when using FVC alone.

Figure 4:
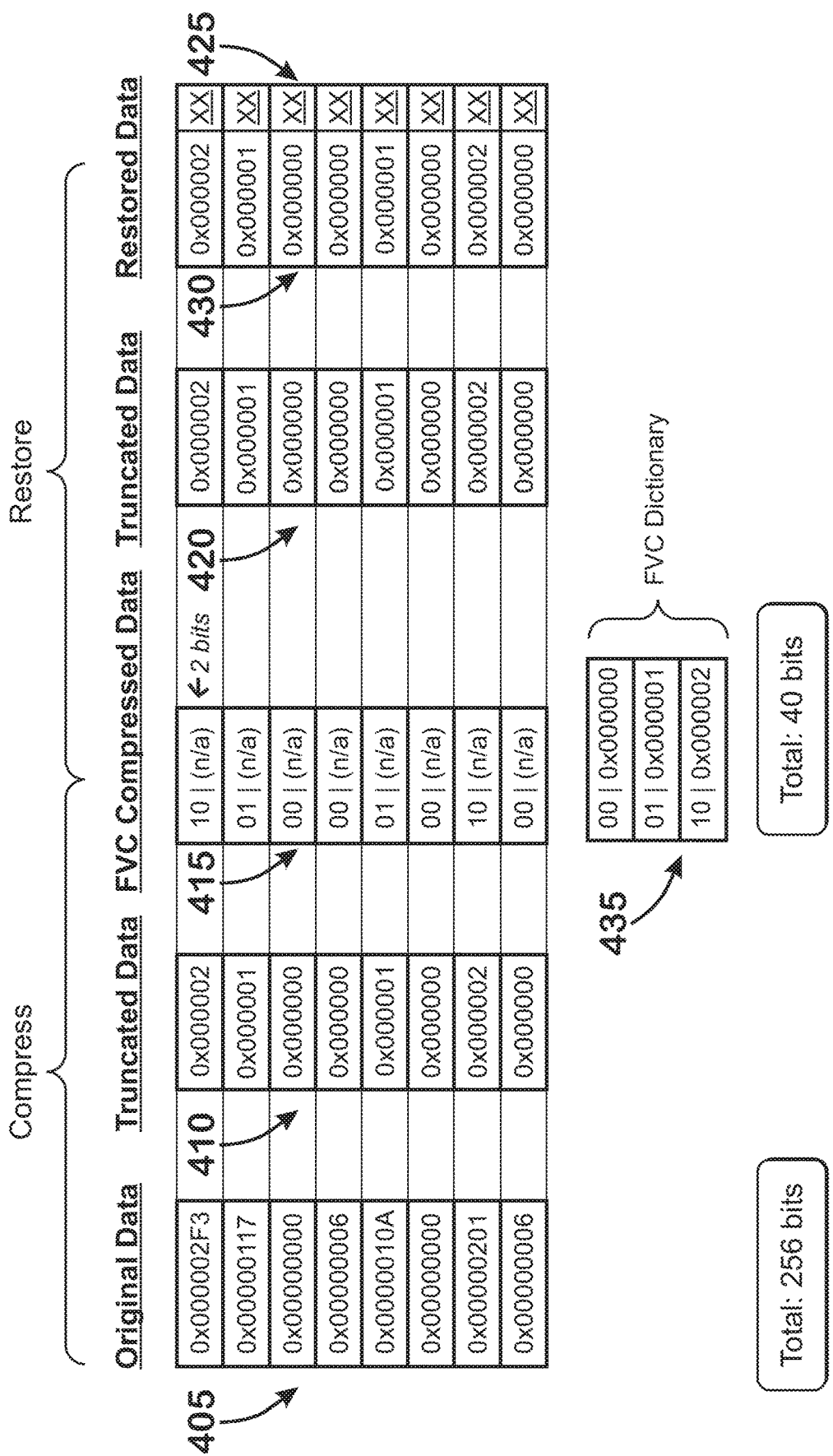
FIG. 4 is an example of data compression and restoration according to certain implementations.

FIG. 4 illustrates an example that demonstrates the improved efficiency of process 200C. In this example, raw data 405 is received according to step 211. In this example, the raw data 405 consists of 256 bits that represent eight 32-bit words. In step 212, parameter k is set to 2, and the least significant bits are truncated. The raw data 405 is then truncated according to step 213 to form truncated data 410. The truncated data 410 is then compressed according to step 214 to form compressed data 415. In this example, FVC compression is used with a dictionary 435 in step 214. By applying process 300C to the raw data 405, only 40 bits are required as compared to 208 bits when using FVC alone.

FIG. 4 further illustrates the restoration of the compressed data 415 according to the restoration process 200D. In step 221 the compressed data 415 is received. Then the compressed data 415 is decompressed according to step 222 to form decompressed truncated data 420. In this example, decompression is performed using FVC and dictionary 435. Restoration bits 425 are then concatenated to the decompressed truncated data 420 to form restored data 430 according to step 335.

Figure 5A:
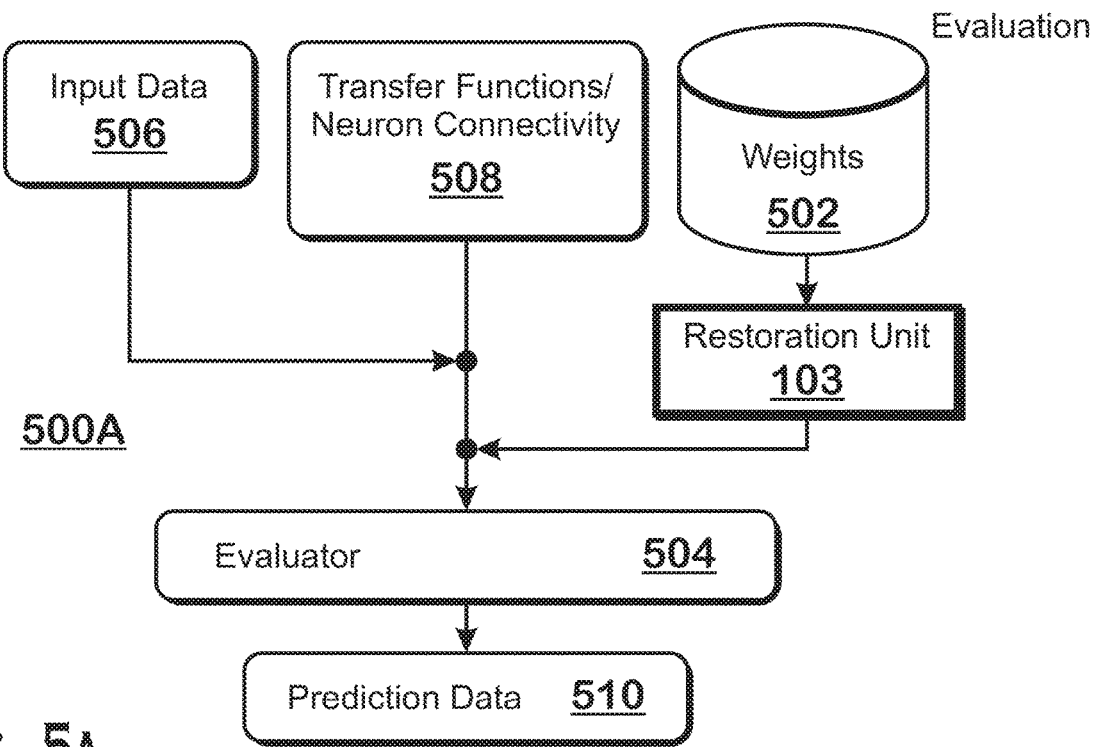
FIG. 5A is a block diagram of a machine learning system that utilizes the restoration unit for evaluation.

FIG. 5A is a block diagram of a machine learning system 500A that utilizes the restoration unit 103 for evaluation. The system 500A includes database 502 of weights. The weights stored in the database 502 assign a relative importance to each of a plurality of inputs received by neuron nodes in the evaluator 504.

The restoration unit 103 receives the weights from the database 502 as an input. The restoration unit 103 then performs process 200D to produce restored data that is transmitted to the evaluator 504.

The evaluator 504 receives the restored weights from the restoration unit 103. The evaluator 504 is composed of a plurality of interconnected neuron nodes. Each of the interconnected neurons receives a plurality of inputs from other neuron nodes or an input source 506. Then each neuron node computes an individual output based on the weights received from the database 502 and the transfer functions 508. The evaluator 504 outputs a prediction data 510 based on the individual output of each of the plurality of interconnected neuron nodes.

Figure 5B:
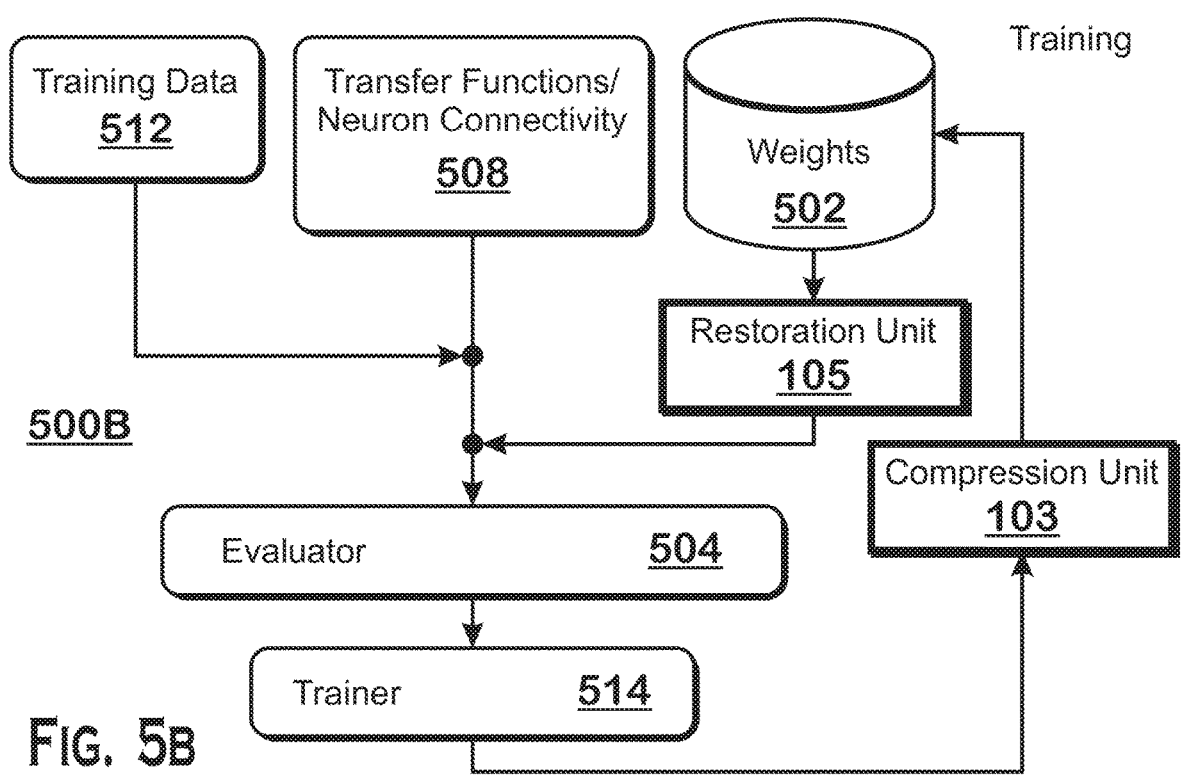
FIG. 5B is a block diagram of a machine learning system that utilizes the compression unit and restoration unit for training.

FIG. 5B is a block diagram of a machine learning system 500B that utilizes the compression unit 105 and restoration unit 103 for training. The machine learning system 500B includes a trainer 514 that determines weights to be stored in the database 502 based on training data 512. The trainer 514 determines the weights by comparing the prediction data generated by the evaluator 504 to predetermined outputs for training data. The trainer 514 adjusts the weights based on a feedback mechanism.

Once determined by the trainer 514, the weights are stored in the database 502 using the compression unit 105. The compression unit 105 receives the weights as an input. The compression unit 105 then performs process 200C to generate the data that is stored in the database 502.

In some instances, the k value used by the compression unit 105 is dynamically changed through the training process. For instance, in early iterations of the training process, higher levels of noise in the weights can be tolerated. Accordingly, larger k values are used. In this situation, the trainer 514 passes smaller arguments to the compression unit 105. However, as the training progresses and the weights begin to converge, the training process is less tolerant of noise in the weights. Therefore, smaller k values are used. In this situation, the trainer 514 passes smaller k arguments to the compression unit 105.

Figures 6A, 6B:
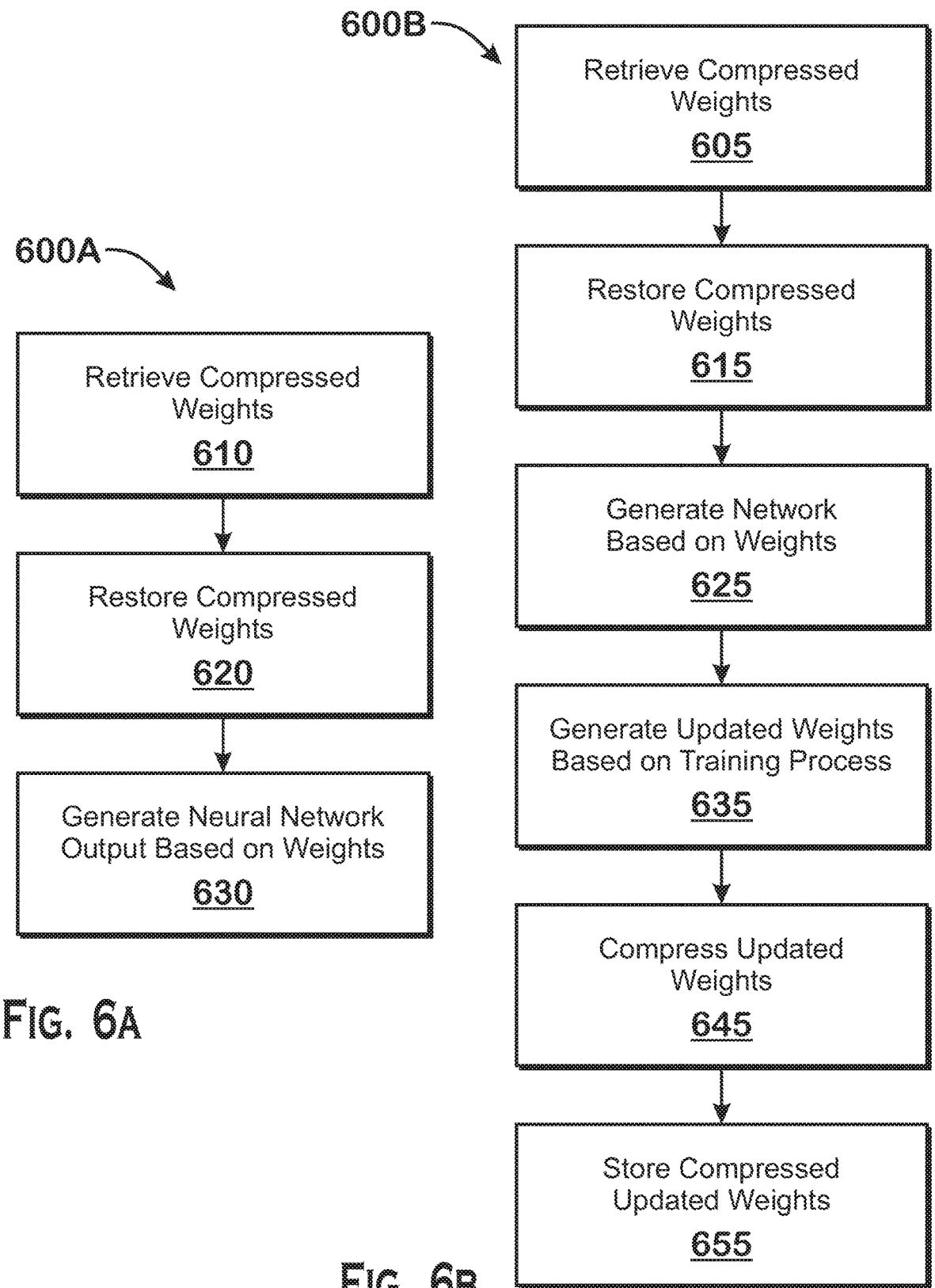
FIG. 6A is an example flow diagram of a machine learning technique to perform an evaluation.
FIG. 6B is an example flow diagram of a machine learning technique to perform training.

FIG. 6A is a flow diagram of an evaluation process 600A. In step 610 the compressed weights are retrieved. Then in step 620, the restoration process 200D is performed on the compressed weights retrieved to generate restored weights. Then an output is generated in step 630 by a neuro network based on the restored weights.

FIG. 6B is a flow diagram of a training process 600B. In step 605 the compressed weights are retrieved. Then in step 615, the restoration process 200D is performed on the compressed weights retrieved to generate restored weights. An output is then generated in step 625 by a neural network using the restored weights. A training process is then performed on the output in step 635. The result of the training process is new weights. The new weights are then compressed in step 645 according to process 200C. The compressed new weights are then stored in step 655.

It should be understood that many variations are possible based on the disclosure herein. Although features and elements are described above in particular combinations, each feature or element may be used alone without the other features and elements or in various combinations with or without other features and elements.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the embodiments.

The methods or flow charts provided herein may be implemented in a computer program, software, or firmware incorporated in a non-transitory computer-readable storage medium for execution by a general purpose computer or a processor. Examples of non-transitory computer-readable storage mediums include a read-only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A data storage and retrieval method comprising:
   receiving data;
   truncating a predetermined number of bits of the data to form truncated data, wherein the predetermined number of bits is determined based on any one or a combination of: a software-defined parameter; a parameter passed in an instruction; a number of training iterations of a machine learning system; available resources of a device; metrics associated with previously compressed data; and a fixed number;
   compressing the truncated data to form compressed data; and
   storing the compressed data in a memory or transmitting the compressed data to a receiving system.

2. The method of claim 1, further comprising:
   retrieving the compressed data;
   decompressing the compressed data to form decompressed truncated data; and
   concatenating restoration bits to the decompressed truncated data to form restored data.

3. The method of claim 2, wherein the restoration bits are selected by sampling from a statistical distribution.

4. The method of claim 3, wherein the statistical distribution is a non-parametric distribution.

5. The method of claim 4, wherein the non-parametric distribution is determined based on previously restored data.

6. The method of claim 3, wherein the statistical distribution is a parametric distribution.

7. The method of claim 6, wherein the parametric distribution is determined based on previously restored data.

8. The method of claim 1, wherein the predetermined number of bits is determined based on previously compressed data or a desired level of noise.

9. The method of claim 1, further comprising:
   receiving the predetermined number of bits via a software passed argument.

10. A data storage and retrieval system comprising:
    a memory; and
    a processor communicatively coupled to the memory, wherein the processor:
    retrieves data from the memory,
    truncates a predetermined number of bits of the data to form truncated data, wherein the predetermined number of bits is determined based on any one or a combination of: a software-defined parameter; a parameter passed in an instruction; a number of training iterations of a machine learning system; available resources of a device; metrics associated with previously compressed data; and a fixed number;
    compresses the truncated data to from compressed data; and
    stores the compressed data in the memory or transmits the compressed data to a receiving system.

11. The system of claim 10, where in the processor further:
    retrieves the compressed data;
    decompresses the compressed data to form decompressed truncated data; and
    concatenates restoration bits to the decompressed truncated data to form restored data.

12. The system of claim 11, wherein the restoration bits are selected by sampling from a statistical distribution.

13. The system of claim 12, wherein the statistical distribution is a non-parametric distribution.

14. The system of claim 13, wherein the non-parametric distribution is determined based on previously restored data.

15. The system of claim 12, wherein the statistical distribution is a parametric distribution.

16. The system of claim 15, wherein the parametric distribution is determined based on previously restored data.

17. The system of claim 10, wherein the predetermined number of bits is determined based on previously compressed data or a desired level of noise.

18. The system of claim 10, wherein the processor further:
receiving the predetermined number of bits via a software passed argument.

19. A non-transitory computer readable storage medium storing instructions, that when executed by a processor cause the processor to:
retrieve data from a memory,
truncate a predetermined number of bits of the data to form truncated data, wherein the predetermined number of bits is determined based on any one or a combination of: a software-defined parameter; a parameter passed in an instruction; a number of training iterations of a machine learning system; available resources of a device; metrics associated with previously compressed data; and a fixed number;
compress the truncated data to form compressed data; and
store the compressed data in the memory or transmit the compressed data to a receiving system.

20. The non-transitory computer readable storage medium of claim 19, wherein the instructions further cause the processor to:
retrieve the compressed data;
decompress the compressed data to form decompressed truncated data; and
concatenate restoration bits to the decompressed truncated data to form restored data.

* * * * *